US011011717B2

(12) United States Patent
He et al.

(10) Patent No.: US 11,011,717 B2
(45) Date of Patent: May 18, 2021

(54) PHOTODETECTORS AND PHOTOVOLTAIC DEVICES

(71) Applicant: King Abdullah University of Science and Technology, Thuwal (SA)

(72) Inventors: Jr-Hau He, Thuwal (SA); Meng-Lin Tsai, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/217,300

(22) Filed: Dec. 12, 2018

(65) Prior Publication Data
US 2019/0252631 A1    Aug. 15, 2019

Related U.S. Application Data

(62) Division of application No. 15/667,312, filed on Aug. 2, 2017.

(Continued)

(51) Int. Cl.
*H01L 51/42*    (2006.01)
*H01L 51/44*    (2006.01)
(Continued)

(52) U.S. Cl.
CPC .... *H01L 51/4213* (2013.01); *H01L 21/02546* (2013.01); *H01L 21/02554* (2013.01); *H01L 31/0384* (2013.01); *H01L 31/0445* (2014.12); *H01L 51/426* (2013.01); *H01L 51/441* (2013.01); *H01L 51/0045* (2013.01); *Y02E 10/549* (2013.01)

(58) Field of Classification Search
None
See application file for complete search history.

(56) References Cited

U.S. PATENT DOCUMENTS

2010/0126273 A1*  5/2010  Lim ................. G01P 15/04
                                            73/514.16
2011/0076464 A1*  3/2011  Elschner ......... H01L 51/0016
                                            428/195.1
(Continued)

FOREIGN PATENT DOCUMENTS

CN        104291321 A1    1/2015

OTHER PUBLICATIONS

Kim, Jung Kyu et al., "Surface-Engineered Graphene Quantum Dots Incorporated into Polymer Layers for High Performance Organic Photovoltaics", Scientific Reports, Nature.com, 5:14276, pp. 1-10. (Year: 2015).*

(Continued)

*Primary Examiner* — Tamir Ayad
(74) *Attorney, Agent, or Firm* — Billion & Armitage

(57) ABSTRACT

Embodiments of the present disclosure describe a photodetector and/or photovoltaic device comprising a semiconducting substrate and a solution including at least GQD and PEDOT:PSS, the solution deposited as a layer on the semiconducting substrate. Embodiments of the present disclosure further describe a method of fabricating a photodetector and/or photovoltaic device comprising contacting an amount of GQD with PEDOT:PSS sufficient to form a solution; and depositing the solution as a layer on a semiconducting substrate.

15 Claims, 7 Drawing Sheets

Related U.S. Application Data

(60) Provisional application No. 62/369,999, filed on Aug. 2, 2016.

(51) Int. Cl.
  *H01L 31/0445*  (2014.01)
  *H01L 51/00*  (2006.01)
  *H01L 21/02*  (2006.01)
  *H01L 31/0384*  (2006.01)

(56) References Cited

U.S. PATENT DOCUMENTS

| | | | |
|---|---|---|---|
| 2012/0068154 A1 | 3/2012 | Hwang | |
| 2014/0011314 A1* | 1/2014 | Ryu | H01L 31/18 438/57 |
| 2014/0083502 A1 | 3/2014 | Wu et al. | |
| 2014/0145145 A1 | 5/2014 | Lee | |
| 2014/0190730 A1* | 7/2014 | Frey | H01B 1/127 174/257 |
| 2015/0279503 A1 | 10/2015 | Scheel | |
| 2015/0361223 A1 | 12/2015 | Woo | |
| 2016/0064679 A1 | 3/2016 | Ajiki | |
| 2016/0169988 A1 | 6/2016 | Sirringhaus | |

OTHER PUBLICATIONS

M. Hakimi, A. Salehi and F. A. Boroumand, "Fabrication and Characterization of an Ammonia Gas Sensor Based on PEDOT-PSS With N-Doped Graphene Quantum Dots Dopant," in IEEE Sensors Journal, vol. 16, No. 16, pp. 6149-6154, Aug. 15, 2016, doi: 10.1109/JSEN.2016.2585461. (Year: 2016) (prior publication date Jun. 28, 2016).*

T. Chen, B. Huang, Y. Huang, E. Chen, P. Yu and H. Meng, "Fabrication and device modeling of micro-textured conductive polymer/silicon heterojunction solar cells," 2012 38th IEEE Photovoltaic Specialists Conference, Austin, TX, 2012, pp. 003142-003145, doi: 10.1109/PVSC.2012.6318245. (Year: 2012).*

Li, Shuxin et al., "Flexible Si/PEDOT:PSS hybrid solar cells", Nano Research 2015, 8(10): 3141-3149. (Year: 2015).*

Dou, et al., Solution-processed hybrid perovskite photodetectors with high detectivity. Nat. Commun. 5, 5404 (2014).

Gong, et al., High-detectivity polymer photodetectors with spectral response from 300 nm to 1450 nm. Science 325, 1665-1667 (2009).

Konstantatos, et al., Ultrasensitive solution-cast quantum dot photodetectors. Nature 442, 180-183 (2006).

Un, et al., A broadband and omnidirectional light-harvesting scheme employing nanospheres on Si solar cells. Nano Energy 6, 36-43 (2014).

Ma, et al., Heterostructured WS2/CH3NH3PbI3 photoconductors with suppressed dark current and enhanced photodetectivity. Adv. Mater. doi: 10.1002/adma.201600069 (2016).

Oshima, et al., Ultra-thin epitaxial films of graphite and hexagonal boron nitride on solid surfaces. J. Phys.: Condens. Matter 9, 1-20 (1997).

Tsai, et al., Solar-blind photodetectors for harsh electronics. Scientific Report 4, 2628 (2013).

Wei, et al., See-through Ga2O3 solar-blind photodetectors for use in harsh environments. IEEE J. Select. Topics Quantum Elect. 20, 3802006 (2014).

Lien, et al., 4H-SiC metal-semiconductor-metal ultraviolet photosemiconductors in operation of 450° C. IEEE Electron Dev. Lett. 33, 1586-1588 (Nov. 2012).

Lin, et al., The packaging glass with hierarchically nanostructured surface: a universal method to achieve self-cleaning omnidirectional solar cells. ACS Nano 10, 549-555 (2016).

Maculan, et al., CH3NH3PbCl3 single crystals: inverse temperature crystallization and visible-blind UV-photodetector. J. Phys. Chem. Lettt. 6, 3781-3786 (2015).

McDonald, et al., Solution-processed PbS quantum dot infrared photodetectors and photovoltaics Nature Mater. 4, 138-142 (Sep. 2005).

Tsai, et al., Efficiency enhancement of silicon heterojunction solar cells via photon management using graphene quantum dot as downconverters. Nano Lett. 16, 309-313 (2016).

Tsai, et al., Few layer MoS2 with broadband high photogain and fast optical switching for use in harsh environments. ACS Nano 7, 3905-3911 (Apr. 2013).

Tsai, et al., Si hybrid solar cells with up to 13% efficiency via concurrent improvement in optical and electrical properties by employing graphene quantum dots. ACS Nano 10, 815-821 (2016).

Tsai, et al., Ultrahigh responsivity broadband detection of Si metal-semiconductor-metal Schottky photodetectors improved by ZnO nanorod arrays. ACS Nano 5, 7748-7753 (Sep. 2011).

Wang, et al., Periodic Si nanopillar arrays fabricated by colloidal lithography and catalytic etching for broadband and omnidirectional elimination of Fresnel reflection. Langmuir 26, 12855 (Jul. 2010).

Wang, et al., Toward efficient and omnidirectional n-type Si solar cells: concurrent improvement in optical and electrical characteristics by employing microscale hierarchical structures. ACS Nano 8, 2959-2969 (2014).

He, et al., "High-Efficiency Si/Polymer Hybrid Solar Cells Based on Synergistic surface Texturing of Si Nanowires on Pyramids", Wiley-VCH Verlag GmbH & Co. KGaA, Weinheim, www.small-journal.com , No. 11, 2012, 1664-1668.

Kepic, et al., "Preparation of PEDOT:PSS thin films doped with graphene and graphene quantum dots", Synthetic Metals, 198, 2014, 150-154.

* cited by examiner

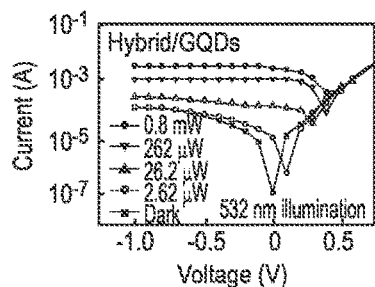
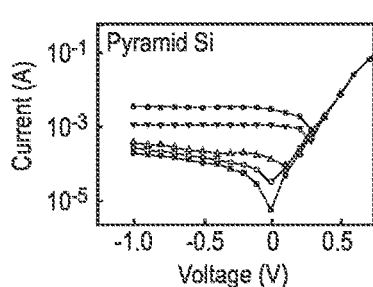
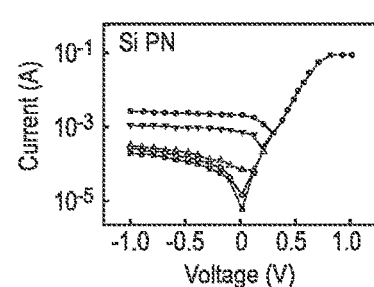
FIG. 3D  FIG. 3B  FIG. 3C
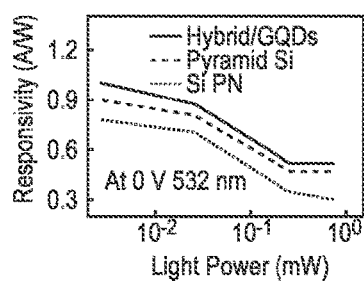
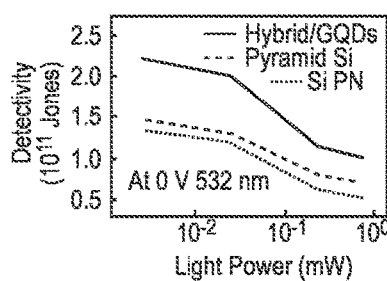
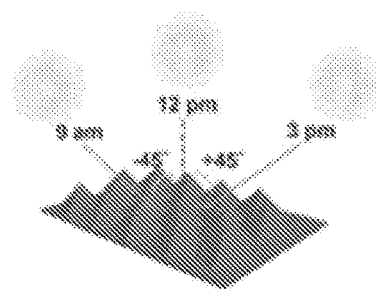
FIG. 3D  FIG. 3E  FIG. 3F
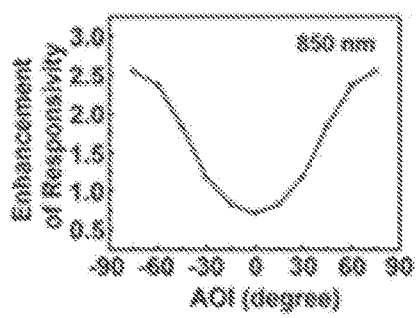
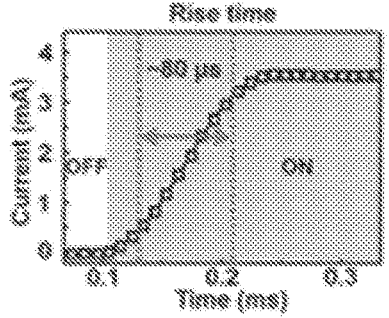
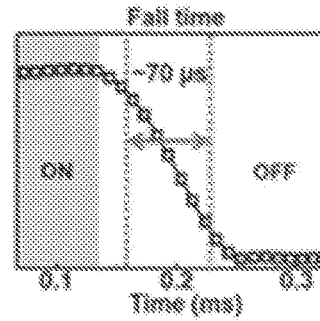
FIG. 3G  FIG. 3H  FIG. 3I

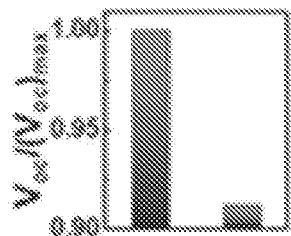 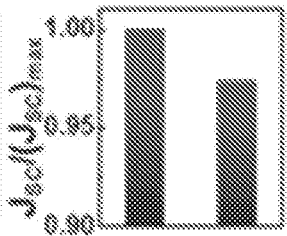 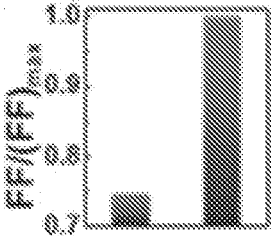 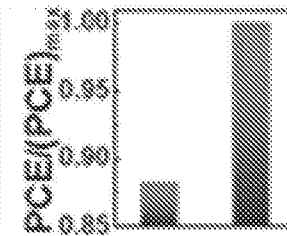
FIG. 4D     FIG. 4E     FIG. 4F     FIG. 4G
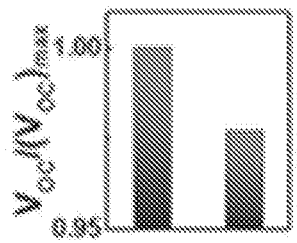 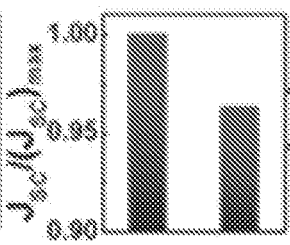 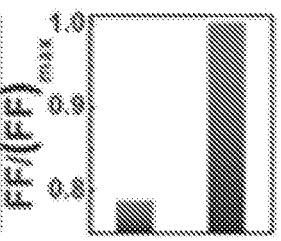 
FIG. 4H     FIG. 4I     FIG. 4J     FIG. 4K
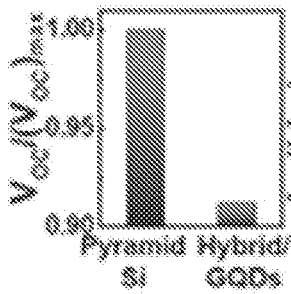 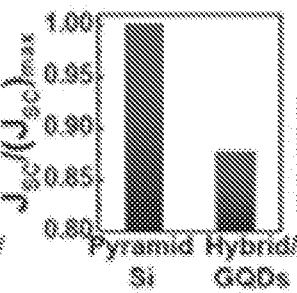 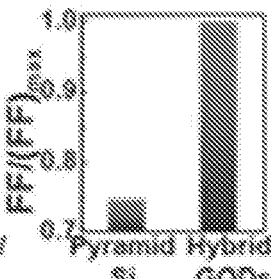 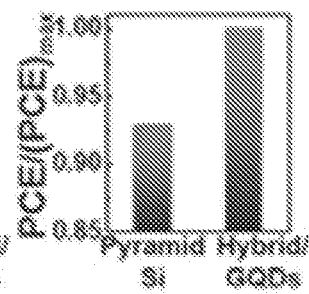
FIG. 4L     FIG. 4M     FIG. 4N     FIG. 4O

PHOTODETECTORS AND PHOTOVOLTAIC DEVICES

BACKGROUND

GaN-, Si-, and InGaAs-based detectors have been widely used for ultraviolet (250 nm to 400 nm), visible (450 nm to 800 nm), and infrared (900 nm to 1700 nm), respectively. However, the cost of these photodetectors is high and the design is complex because these detectors require cooling systems in order to increase sensitivity and reduce noise levels. While functional 2D photodetectors with ultrahigh gain, photodetectors for harsh electronics, and see-through solar-blind photodetectors have been successfully fabricated, these functional photodetectors typically require high operation voltage and have a limited detection wavelength range. As a result, the potential of using these devices in practical applications is inhibited.

High-detectivity polymer photodetectors with spectral response from 300 nm to 1450 nm have also been reported. For instance, photodetectors based on poly(5,7-bis(4-decanyl-2-thienyl)-thieno(3,4-b)diathiazole-thiophene-2,5) (PDDTT), solution-processed perovskite materials, and CdS and PbS quantum dot-based photodetectors have been fabricated. However, compared to Si photodetectors, the detectivity of organic based photodetectors is still relatively low in certain wavelength regions. In addition, the fabrication of Cd and Pb based quantum dots require toxic materials.

In considering the development of next generation photovoltaic applications, a major goal includes weak light and omnidirectional light harvesting. Most light is diffused or scattered through the atmosphere as it reaches the earth. Under an overcast sky, over 90% of the total incident solar radiation is diffused. To date, photon management techniques that enable the omnidirectional light detectability such as hierarchical surface engineering, fabrication of graded refractive index coating, employing colloidal nanospheres, and utilization of periodic nanopillar arrays have been applied in various optical devices. These omnidirectional light-harvesting techniques, however, require complex fabrication processes that result in unwanted defects, recombination sites, and contaminations that deteriorate performance with respect to omnidirectionality and thus require additional treatment procedures. Therefore, it is of great importance to develop more straightforward outdoor weak light harvesting techniques with extraordinary omnidirectional light absorption properties that can also be used, for example, in indoor applications such as smart home and intelligent building.

SUMMARY

In general, embodiments of the present disclosure describe photodetector and/or photovoltaic devices and methods of fabricating photodetector and/or photovoltaic devices.

Accordingly, embodiments of the present disclosure describe a photodetector and/or photovoltaic device comprising a semiconducting substrate and a solution including at least GQD and PEDOT:PSS, the solution forming a layer on the semiconducting substrate.

Embodiments of the present disclosure further describe a method of fabricating a photodetector and/or photovoltaic device comprising contacting an amount of GQD with PEDOT:PSS sufficient to form a solution; and depositing the solution as a layer on a semiconducting substrate.

The details of one or more examples are set forth in the description below. Other features, objects, and advantages will be apparent from the description and from the claims.

BRIEF DESCRIPTION OF DRAWINGS

This written disclosure describes illustrative embodiments that are non-limiting and non-exhaustive. In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

Reference is made to illustrative embodiments that are depicted in the figures, in which:

FIG. 3A illustrates a graphical view of I-V characteristics of hybrid/GQDs photodetectors measured in the dark and under 532-nm illumination with different light power intensities, according to one or more embodiments of the present disclosure.

FIG. 3B illustrates a graphical view of I-V characteristics of pyramid Si photodetectors measured in the dark and under 532-nm illumination with different light power intensities, according to one or more embodiments of the present disclosure.

FIG. 3C illustrates a graphical view of I-V characteristics of Si PN photodetectors measured in the dark and under 532-nm illumination with different light power intensities, according to one or more embodiments of the present disclosure.

FIG. 3D illustrates a graphical view of 532-nm laser intensity-dependent responsivity of hybrid/GQDs photodetectors, pyramid Si photodetectors, and Si PN photodetectors measured under 0 V, according to one or more embodiments of the present disclosure.

FIG. 3E illustrates a graphical view of 532-nm laser intensity-dependent detectivities of hybrid/GQDs photodetectors, pyramid Si photodetectors, and Si PN photodetectors measured under 0 V, according to one or more embodiments of the present disclosure.

FIG. 3F illustrates a schematic view of angular dependent photodetection and power generation during a day in real world, according to one or more embodiments of the present disclosure.

FIG. 3G illustrates a graphical view of enhancement of responsivity of hybrid/GQDs photodetectors measured at 0 V under 850-nm light illumination, according to one or more embodiments of the present disclosure.

FIG. 3H illustrates a graphical view of the rise time of hybrid/GQDs photodetectors measured at 0 V under 850-nm light illumination, according to one or more embodiments of the present disclosure.

FIG. 3I illustrates a graphical view of the fall time of hybrid/GQDs photodetectors measured at 0 V under 850-nm light illumination, according to one or more embodiments of the present disclosure.

FIGS. 4D-G illustrates a graphical view of a comparison of $V_{oc}$ (FIG. 4D), $J_{sc}$ (FIG. 4E), FF (FIG. 4F), and PCE (FIG. 4G) between pyramid Si and hybrid/GQDs solar cells at 17:30 on Apr. 26, 2014 (Sunny) at the location of 25° 1'7" N and 121° 32'31" E, according to one or more embodiments of the present disclosure.

FIGS. 4H-K illustrates a graphical view of a comparison of $V_{oc}$ (FIG. 4H), $J_{sc}$ (FIG. 4I), FF (FIG. 4J), and PCE (FIG. 4K) between pyramid Si and hybrid/GQDs solar cells at 13:00 on Apr. 27, 2014 (Cloudy) at the location of 25° 1'7" N and 121° 32'31" E, according to one or more embodiments of the present disclosure.

FIGS. 4L-O illustrates a graphical view of a comparison of $V_{oc}$ (FIG. 4L), (FIG. 4M), FF (FIG. 4N), and PCE (FIG. 4O) between pyramid Si and hybrid/GQDs solar cells under a LED with a power density of 3.5 mW/cm$^2$, according to one or more embodiments of the present disclosure.

DETAILED DESCRIPTION

Figure 1:
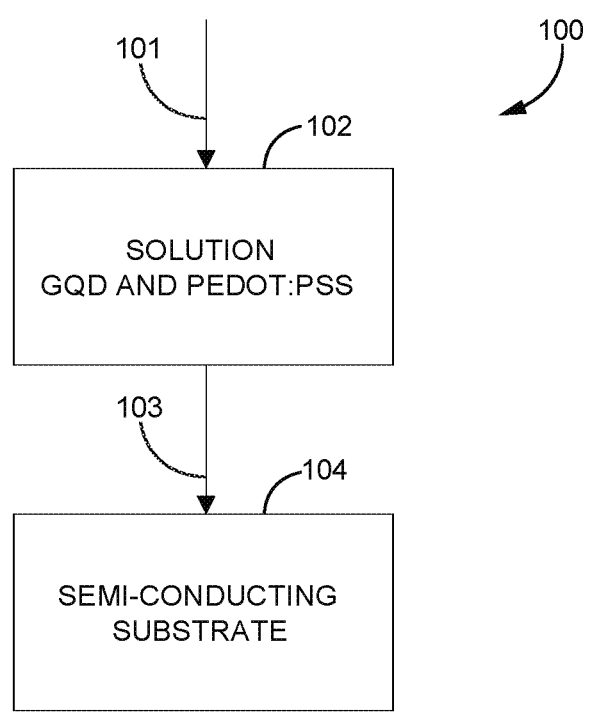
FIG. 1 illustrates a block flow diagram of a method of fabricating a photodetector and/or photovoltaic device, according to one or more embodiments of the present disclosure.

The invention of the present disclosure relates to photodetectors and photovoltaic devices. In particular, the photodetectors and photovoltaic devices of the present disclosure relate to graphene quantum dot-modified (GQD) poly(3,4-ethylene-dioxythiophene) polystyrene sulfonate (PEDOT:PSS) hybrid photodetectors and photovoltaic devices. The photodetectors and photovoltaic devices of the present disclosure are superior to conventional devices, such as conventional Si p-n cells. The photodetectors and photovoltaic devices of the present disclosure perform exceptionally well in low-light photodetection and photovoltaic applications and exhibit ultrafast response times. For instance, the photodetectors and photovoltaic devices of the present disclosure can be used in sensitive photosensing applications, such as low-light level biological imaging applications. In addition, the photodetectors and photovoltaic devices of the present disclosure can be used for high-speed optical communication. These examples, however, should not be viewed as limiting, as the photodetectors and photovoltaic devices of the present disclosure can be used in innumerable applications, especially with respect to next generation energy devices.

The photodetectors and photovoltaic devices of the present disclosure exhibit extraordinary omnidirectional light absorption properties and/or exceptional weak light detection capabilities. The photodetectors and photovoltaic devices of the present disclosure can be used to harvest omnidirectional light and/or weak light. The photodetectors and photovoltaic devices of the present disclosure can exhibit one or more of high detectivity, high sensitivity, high responsivity, and low noise levels over a broad wavelength range, without requiring any cooling. The photodetectors and photovoltaic devices of the present disclosure are self-powered with low operation voltage. In addition, the photodetectors and photovoltaic devices of the present disclosure can be fabricated via a simple, non-complex method that does not require the use of any toxic materials. The photodetectors and photovoltaic devices of the present disclosure can be fabricated to minimize and/or eliminate unwanted defects, recombination sites, and contaminations. The photodetectors and photovoltaic devices of the present disclosure can be self-powered and/or ultralow powered.

Accordingly, embodiments of the present disclosure describe photodetectors and/or photovoltaic devices, as well as methods of fabricating photodetectors and/or photovoltaic devices. More specifically, embodiments of the present disclosure describe a photodetector and/or photovoltaic device comprising a semiconducting substrate and a solution including at least GQD and PEDOT:PSS, the solution deposited as a layer on the semiconducting substrate. Embodiments of the present disclosure further describe a method of fabricating a photodetector and/or photovoltaic device comprising contacting an amount of GQD with PEDOT:PSS sufficient to form a solution; and depositing the solution as a layer on a semiconducting substrate.

Definitions

The terms recited below have been defined as described below. All other terms and phrases in this disclosure shall be construed according to their ordinary meaning as understood by one of skill in the art.

As used herein, "contacting" refers to the act of touching, making contact, or of bringing to immediate or close proximity, including at the cellular or molecular level, for example, to bring about a physiological reaction, a chemical reaction, or a physical change, e.g., in a solution, in a reaction mixture, in vitro, or in vivo. Accordingly, treating, tumbling, vibrating, shaking, mixing, and applying are forms of contacting to bring two or more components together.

As used herein, "dark current" refers to the current flowing through a photodetector even in the absence of light.

As used herein, "deposit," "deposited," and/or "depositing" refers to etching, doping, epitaxy, thermal oxidation, sputtering, casting, depositing, spin-coating, evaporating, applying, treating, and any other technique and/or method known to a person skilled in the art.

As used herein, "detectivity" refers to the square root of the detector area divided by the noise equivalent power.

As used herein, "gain" refers to the output current of a photodetector divided by the current directly produced by the photons incident on the detectors.

As used herein, "GQD" refers to graphene quantum dot(s).

As used herein, "PEDOT:PSS" refers to poly(3,4-ethylene-dioxythiophene) polystyrene sulfonate. PEDOT:PSS is a macromolecular salt including a sulfonated polystyrene bearing a negative charge upon deprotonation of the sulfonyl group and a PEDOT conjugated polymer bearing a positive charge via polythiophene.

As used herein, "photodetector" refers to light sensors and/or other electromagnetic energy sensors that convert light signals into voltage or current. Non-limiting examples of photodetectors include one or more of photodiodes, phototransistors, and solar cells.

As used herein, "photovoltaic" refers to the conversion of light into electricity using semiconductor materials that exhibit the photovoltaic effect.

As used herein, "responsivity" refers to a measure of the input-output gain of a photodetector. More specifically, "responsivity" refers to a measure of the electrical output per optical input in units of amperes or volts per watt of incident radiant power.

As used herein, "TEM" refers to transmission electron microscopy.

Embodiments of the present disclosure describe photodetectors and/or photovoltaic devices and methods of fabricating photodetectors and/or photovoltaic devices.

Embodiments of the present disclosure describe photodetectors and/or photovoltaic devices comprising a semiconducting substrate and a solution including at least GQD and PEDOT:PSS. The solution is deposited on the semiconducting substrate.

The semiconducting substrate can be one or more of an n-type semiconductor and a p-type semiconductor. The semiconducting substrate can be one or more of a solid, a crystalline solid, amorphous, and a liquid. The semiconducting substrate can include any type of semiconducting material, compound, and/or element. The semiconducting substrate can be one or more of a Group IV elemental semiconductor, Group IV compound semiconductor, Group VI elemental semiconductor, III-V semiconductor, II-VI semiconductor, I-VII semiconductor, IV-VI semiconductor, IV-VI semiconductor, V-VI semiconductor, II-V semiconductor, I-III-VI$_2$ semiconductor, layered semiconductor, magnetic semiconductor, and charge-transfer semiconductor. The semiconducting substrate can include one or more of a tertiary compound, oxide, and alloy. The semiconducting material can include one or more of any element of the periodic table. The semiconducting substrate can include an organic compound. The semiconducting substrate can include one or more of zinc, cadmium, aluminum, gallium, indium, thallium, carbon, silicon, germanium, tin, lead, arsenic, antimony, bismuth, sulfur, selenium, tellurium, and polonium.

In some embodiments, the semiconducting substrate is a silicon substrate. In some embodiments, the semiconducting substrate is an n-type silicon substrate. In some embodiments, the semiconducting substrate is a p-type silicon substrate. In some embodiments, the semiconducting substrate can include micro arrays fabricated on a surface of the semiconducting substrate. In some embodiments, the semiconducting substrate can include one or more of micropyramid arrays, nanowires, microwires, nanopillars, and microgrooves fabricated on a surface of the semiconducting substrate. In some embodiments, the micropyramid arrays are fabricated via depositing. In some embodiments, the micropyramid arrays are fabricated via a chemical etching process.

The solution includes at least GQD and PEDOT:PSS. In some embodiments, the solution includes at least carbon dots and PEDOT:PSS. In some embodiments, the solution can include between about 0.1 wt % to about 10 wt % of GQD. In some embodiments, the solution can include about 0.5 wt % of GQD. In some embodiments, the solution can include about 1 wt % to about 99 wt % of PEDOT:PSS. In some embodiments, the solution can further include one or more of a solvent, a surfactant, and fluoroadditives. In some embodiments, the fluoroadditive is Dupont Zonyl. In some embodiments, the solvent can include an organic solvent. In some embodiments, the solvent can include dimethyl sulfoxide. In some embodiments, the solution can include about 5 wt % of dimethyl sulfoxide. In some embodiments, the solution can include about 0.1 wt % of surfactant. In some embodiments, the surfactant can be Triton X-100 (Sigma-Aldrich). In some embodiments, the surfactant can be Nonidet-P40.

The solution can be deposited as a layer on the semiconducting substrate. In some embodiments, the solution is deposited by one or more of etching, doping, epitaxy, thermal oxidation, sputtering, casting, depositing, spin-coating, evaporating, applying, and treating. The solution can be deposited via any type of means for depositing the solution as a layer on the semiconducting substrate. A person skilled in the art would readily understand other means for depositing the solution as a layer on the semiconducting substrate.

In some embodiments, the solution is annealed. In some embodiments, the solution is annealed between about 140° C. and about 180° C. In some embodiments, the solution is annealed between about 30 seconds to about 1 hour. In some embodiments, the solution is annealed at about 165° C. for about 10 minutes.

In some embodiments, the photodetector and/or photovoltaic device can further include electrodes. In some embodiments, each of the electrodes can be deposited onto opposing surfaces of the semiconducting substrate via thermal evaporation. The electrodes can include any type of material, compound, and/or element known in the art. In some embodiments, the electrodes can include one or more of Ag, Al, Au, Pt, and Ti.

Embodiments of the present disclosure further describe a method of fabricating a photodetector and/or photovoltaic device. FIG. 1 illustrates a block flow diagram of a method of fabricating a photodetector and/or photovoltaic device. As shown in FIG. 1, the method 100 includes contacting 101 an amount of GQD with PEDOT:PSS sufficient to form a solution 102; and depositing 103 the solution on a semiconductor substrate 104. The disclosure above is hereby incorporated by reference in its entirety.

Contacting can include one or more of the act of touching, making contact, or bringing into immediate or close proximity, including at the cellular or molecular level to, for example, bring about a physiological reaction, a chemical reaction, or a physical change, e.g., in a solution, in a reaction mixture, in vitro, or in vivo. Contacting can include treating, tumbling, vibrating, shaking, mixing, and applying to bring two or more components together.

Depositing can include any means for depositing the solution as a layer on the semiconducting substrate. In some embodiments, depositing can include one or more of etching, doping, epitaxy, thermal oxidation, sputtering, casting, depositing, spin-coating, evaporating, applying, and treating. A person skilled in the art would readily understand other means for depositing the solution as a layer on the semiconducting substrate.

The following Examples are intended to illustrate the above invention and should not be construed as to narrow its scope. One skilled in the art will readily recognize that the Examiners suggest many other ways in which the invention could be practiced. It should be understand that numerous variations and modifications may be made while remaining within the scope of the invention.

Example 1

GQD-Modified PEDOT:PSS/Si Hybrid Photodetectors and Photovoltaic Devices

High detectivity GQD-modified PEDOT:PSS/Si hybrid photodetectors and photovoltaic devices were demonstrated with excellent omnidirectional light harvesting capability. Compared with conventional Si p-n photodiodes, the detectivity and responsivity of the hybrid device with GQDs both exhibited ~40% enhancement under 532 nm illumination with light power below 10 μW. At large angles of incidence (AOIs), the hybrid device exhibited more than 2-fold enhancement in responsivity, demonstrating its potential for omnidirectional light detection applications. Real-world cases including human tissue photodetection measurement, outdoor weather dependent photovoltaic characterization, and indoor weak light photovoltaic characterization were also performed. The hybrid device with GQDs exhibited doubled photo-to-dark-current-ratio (PDCR) as compared with traditional Si p-n photodiodes detected 1 cm from the source in human finger tissue measurement. In addition, in the real-world weak light photovoltaic measurement, the GQDs modified hybrid device showed enhanced fill factor (FF) in all weak light conditions, resulting in improved power conversion efficiency (PCE) as compared with conventional Si p-n solar cells. Accordingly, the high-detectivity, low-cost, and omnidirectional properties of the GQD modified hybrid devices along with practical real-world compatibility provide new possibilities for the next-generation photosensing, bioimgaging, and energy generation applications.

Figure 2A:
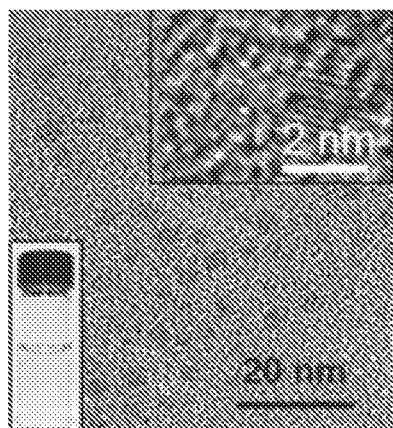
FIG. 2A illustrates a TEM and HRTEM images of GQDs (inset) and a photographic image of GQD solution, according to one or more embodiments of the present disclosure.
Figure 2B:
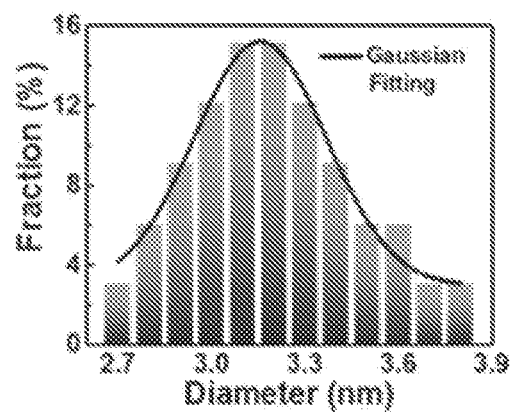
FIG. 2B illustrates a graphical view of the diameter distribution of GQDs measured in TEM images with a Gaussian fitting curve (black line), according to one or more embodiments of the present disclosure.
Figure 2C:
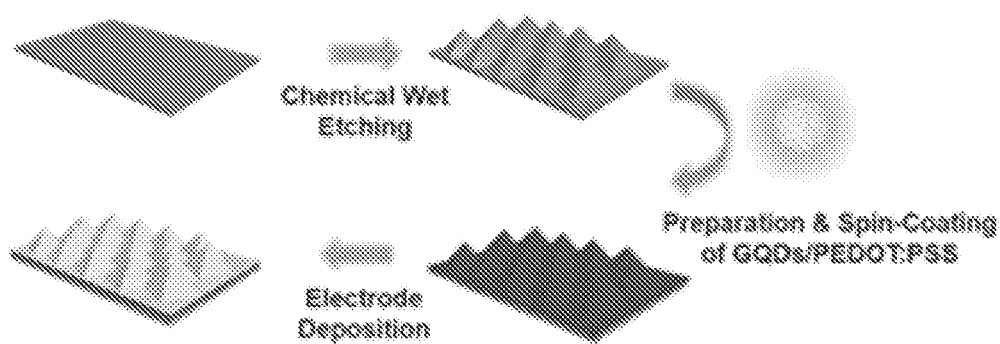
FIG. 2C illustrates a schematic view of a fabrication process of PEDOT:PSS/Si hybrid devices with GQDs, according to one or more embodiments of the present disclosure.

The fabrication process of GQD-modified PEDOT:PSS/Si hybrid devices was carried out according to the procedure shown in FIG. 2C. FIG. 2C illustrates a schematic view of a fabrication process of PEDOT:PSS/Si hybrid devices with GQDs, according to one or more embodiments of the present disclosure. Micropyramid arrays were fabricated on top of the n-type Si substrate using a chemical etching process. 0.5 wt % of GQD was then added to the PEDOT:PSS solution. The PEDOT:PSS solution is composed of PEDOT:PSS (PH 500 from Clevios) with 5 wt % of dimethyl sulfoxide (DMSO from Sigma-Aldrich) and 0.1 wt % of Triton X surfactant (Triton X-100 from Sigma-Aldrich). The PEDOT:PSS/GQDs solution was spin-coated on structured Si substrate and annealed at 165° C. for 10 min. Finally, Ag and Al were thermally evaporated on top and back sides of the sample as contact electrodes.

To characterize the actual size and distribution of as-prepared GQDs, transmission electron microscopy (TEM) was carried out. FIG. 2A illustrates a TEM and HRTEM images of GQDs (inset) and a photographic image of GQD solution, according to one or more embodiments of the present disclosure. The TEM image of the GQDs on carbon film-coated Cu grids is shown in FIG. 2A. The high-resolution TEM (HRTEM) image in the inset of FIG. 2A shows the enlarged structure of a single GQD, exhibiting 0.213-nm fringes corresponding to the d spacing between graphene layers. The photographic image of GQD solution is also shown in the inset. The color of the solution changed from transparent to pale yellow as a result of GQD formation.

FIG. 2B illustrates a graphical view of the diameter distribution of GQDs measured in TEM images with a Gaussian fitting curve (black line), according to one or more embodiments of the present disclosure. In particular, FIG. 2B is the size distribution of GQDs collected from the TEM image. The average size of GQDs was about 3.2 nm, which corresponds to 15 layers of graphene in each QD. In addition, the full-width-at-half-maximum of the fitted Gaussian curve was 0.5 nm, demonstrating that the size of GQDs can be controlled.

FIG. 3A illustrates a graphical view of I-V characteristics of hybrid/GQDs photodetectors measured in the dark and under 532-nm illumination with different light power intensities, according to one or more embodiments of the present disclosure. To compare the GQD-modified hybrid PDs with conventional photodiodes, a commercially available pyramid structured Si p-n cell and a standard Si p-n reference cell were also characterized as control sets and shown in FIG. 3B and FIG. 3C, respectively. More specifically, FIG. 3B illustrates a graphical view of I-V characteristics of pyramid Si photodetectors measured in the dark and under 532-nm illumination with different light power intensities, according to one or more embodiments of the present disclosure and FIG. 3C illustrates a graphical view of I-V characteristics of Si PN photodetectors measured in the dark and under 532-nm illumination with different light power intensities, according to one or more embodiments of the present disclosure. At power intensities above 25.2 μW, under 532-nm illumination, all three cells exhibited similar photocurrent within −1 V and 0.75 V voltage range. However, the dark current of GQD-modified hybrid PD was an order of magnitude smaller than that of the other two PDs, especially near 0 V, demonstrating significantly lower noise level under low-light detection. The low noise level can be attributed to the fact that PEDOT:PSS layer is an ideal electron blocking layer which can effectively prevent unwanted hot carriers from reaching the top electrode at room temperature. For conventional photodetectors, this is usually achieved by cooling the system in order to increase the sensitivity of the device at low-light level.

FIG. 3D illustrates a graphical view of 532-nm laser intensity-dependent responsivity of hybrid/GQDs photodetectors, pyramid Si photodetectors, and Si PN photodetectors measured under 0 V, according to one or more embodiments of the present disclosure. In particular, FIG. 3D shows the responsivity of the cells at 0 V under 532-nm illumination. Due to the above mentioned low noise properties of the GQD-modified hybrid PD, it exhibited highest responsivity at power intensity below 1 mW among all three PDs. At 2.52 μW, the responsivity of the GQD-modified hybrid PD increased to 1.02 A/W, indicting its capability for self-powered low-light photosensing applications.

FIG. 3E illustrates a graphical view of 532-nm laser intensity-dependent detectivities of hybrid/GQDs photodetectors, pyramid Si photodetectors, and Si PN photodetectors measured under 0 V, according to one or more embodiments of the present disclosure. For low-light photodetector characterization, the noise equivalent power (NEP) is usually calculated as the figure of merit:

$$NEP = (A\Delta f)^{1/2}/D^*$$

where A is the effective area of the detector in cm², Δf is the electrical bandwidth in Hz, and D* is the detectivity measured in units of Jones as $$D^* = R/(2qJ_d)^{1/2}$$

where R is the responsivity in A/W, q is the absolute value of electron charge, and $J_d$ is the dark current. At zero bias, the calculated detectivity of the GQD-modified hybrid PD increased from $1.1 \times 10^{11}$ to $2.2 \times 10^{11}$ Jones as the power intensity decreases from 0.8 mW to 2.52 µW. The detectivities within this power intensity region were one order of magnitude larger than the previously reported high-detectivity polymer photodetectors. Accordingly, the self-powered, cooling free, and low-light level detectability properties of GQD-modified hybrid PDs demonstrated here can be well-suited for developing ultralow power, room temperature, and ultrasensitive biological imaging applications.

Figure 6:
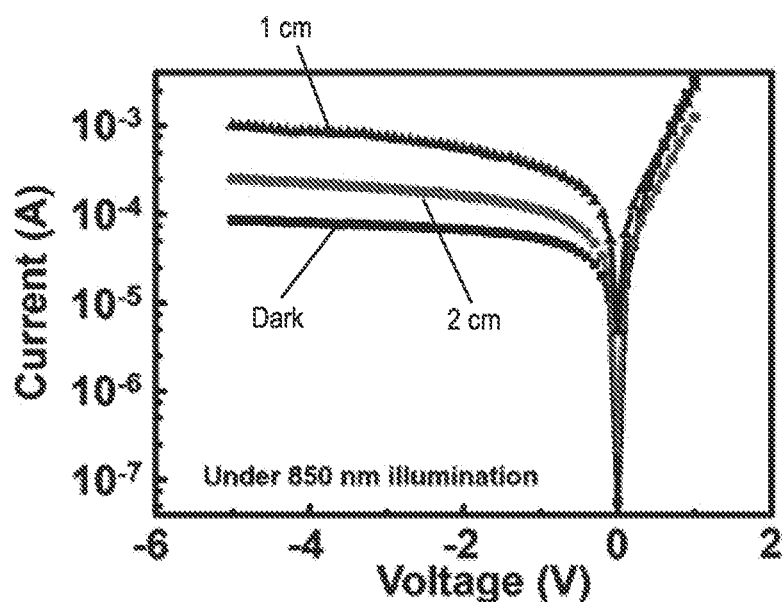
FIG. 6 illustrates a graphical view of I-V characteristics of hybrid/GQDs photodetectors with various 850-nm light propagation distance in the human finger tissue, according to one or more embodiments of the present disclosure.

FIG. 3F illustrates a schematic view of angular dependent photodetection and power generation during a day in real world, according to one or more embodiments of the present disclosure. For real-world photodetection and photovoltaic applications, light could incident from all directions, as indicated in FIG. 3F. Therefore, further angular dependent photodetection properties of the GQD-modified hybrid PD, pyramid structured Si p-n PD, and a standard Si p-n reference PD were characterized and shown in FIG. 6. FIG. 6 illustrates a graphical view of I-V characteristics of hybrid/GQDs photodetectors with various 850-nm light propagation distance in the human finger tissue, according to one or more embodiments of the present disclosure. Since scattered infrared radiation is usually used in optical communication and clinical examination such as oximeters, 850-nm illumination was applied for angular dependent characterization. Due to the micropyramid surface structure, the responsivity of the GQD-modified hybrid PD was enhanced in all AOIs as compared with standard Si p-n reference PD, which exhibited polished planar surface.

FIG. 3G illustrates a graphical view of enhancement of responsivity of hybrid/GQDs photodetectors measured at 0 V under 850-nm light illumination, according to one or more embodiments of the present disclosure. As shown in FIG. 3G, under high AOIs (±75°), the enhancement of responsivity was up to 2.5 folds, demonstrating excellent omnidirectional photodetection properties. In addition, to characterize the temporal resolution of the GQD-modified hybrid PD, rise and fall times of the device is measured and indicated in FIG. 3H and FIG. 3I. More specifically, FIG. 3H illustrates a graphical view of the rise time of hybrid/GQDs photodetectors measured at 0 V under 850-nm light illumination, according to one or more embodiments of the present disclosure. FIG. 3I illustrates a graphical view of the fall time of hybrid/GQDs photodetectors measured at 0 V under 850-nm light illumination, according to one or more embodiments of the present disclosure. The rise and fall times of the device were ~60 µs and ~70 µs, responsively. The ultrafast response time indicated here provides the capability for high-speed optical communication.

Figure 4A:
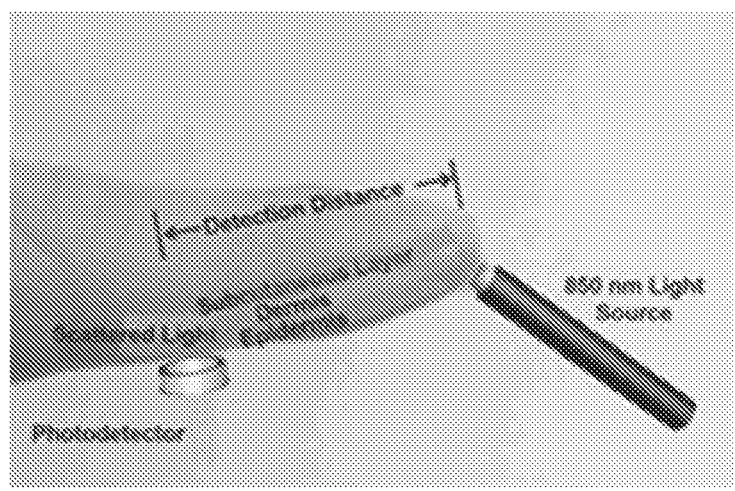
FIG. 4A illustrates a schematic view of 850-nm light propagation measurement in human finger tissue, according to one or more embodiments of the present disclosure.

For demonstrating real-world cases, an oximetry experiment is designed to detect infrared light propagated/scattered in human finger tissue, as shown in FIG. 4A. FIG. 4A illustrates a schematic view of 850-nm light propagation measurement in human finger tissue, according to one or more embodiments of the present disclosure. As infrared light enters the human finger tissue, three types of photons including ballistic photons, quasi-ballistic photons, and diffused photons were generated. The intensities of ballistic and quasi-ballistic photons were high. However, for concentrated tissue media, these types of photons were scarce and their interaction with biological tissue was weak, leading to poor resolution. Therefore, diffused photons were preferred for biological imaging. Since diffused photons interact strongly with surrounding tissue, their intensity was usually weak and require low-light-level photodetectors. The I-V characteristics of GQD-modified hybrid PD at different detection distance are shown in FIG. 6.

Figure 4B:
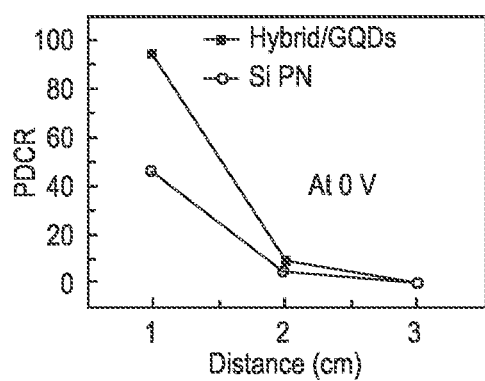
FIG. 4B illustrates a graphical view of hybrid/GQDs photodetector PDCR as a function of various 850-nm light propagation distance in the human finger tissue (light intensity ($I_{light}$)=$0.3\times10^4$ W/m$^2$), according to one or more embodiments of the present disclosure.

FIG. 4B illustrates a graphical view of hybrid/GQDs photodetector PDCR as a function of various 850-nm light propagation distance in the human finger tissue (light intensity $(I_{light})=0.3 \times 10^4$ W/m²), according to one or more embodiments of the present disclosure. In FIG. 4B, the GQD-modified hybrid PD exhibited enhanced PDCR as compared with standard Si reference PD for detection distance shorter than 3 cm. The PDCR of GQD-modified hybrid PD at the detection distance of 1 cm was nearly 100, which is doubled compared with standard Si reference PD. Accordingly, the GQD-modified hybrid PD showed excellent diffused photon collection capability for effective low-light level biological imaging applications.

It is clearly shown in the above discussion that the GQD-modified hybrid device exhibits self-power, omnidirectional, and low-light detection properties. In the J-V curves shown in FIG. 2A, significant photovoltaic behavior was also indicated.

Figure 7:
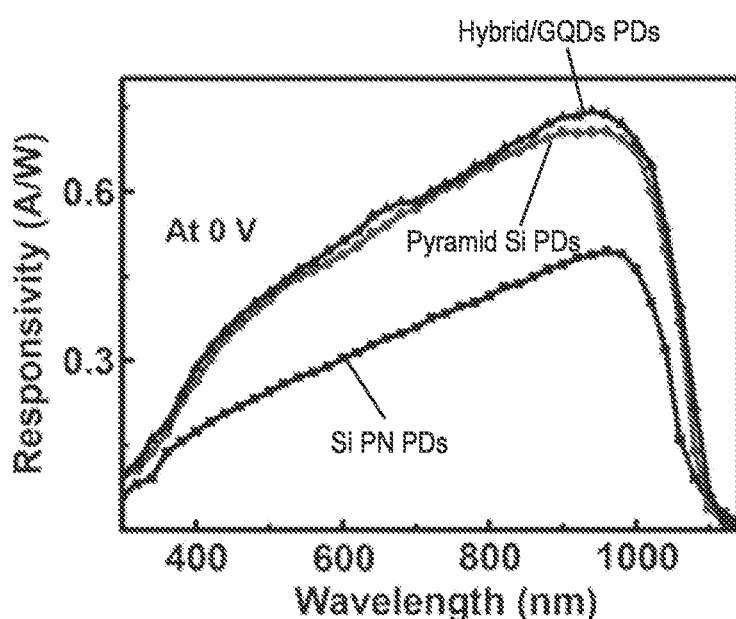
FIG. 7 illustrates a graphical view of spectral responsivity of Si PN, pyramid Si, and hybrid/GQDs photodetectors under 0 V, according to one or more embodiments of the present disclosure.

FIG. 7 illustrates a graphical view of spectral responsivity of Si PN, pyramid Si, and hybrid/GQDs photodetectors under 0 V, according to one or more embodiments of the present disclosure. Compared with the standard Si p-n PD, the pyramid Si p-n device and the GQD-modified hybrid device showed enhanced spectral responsivity throughout the solar irradiance wavelength region due to increased photon absorption by structured surface and concurrent improvement of optical and electrical properties by GQDs. It is well known that for standard AM 1.5 G solar irradiation, the photovoltaic performance of Si solar cells is superior to that of hybrid ones. However, for low-light conditions, surface and bulk recombination in Si become more serious due to unfilled defects, resulting in decreased FF values. In contrast, for hybrid devices, PEDOT:PSS is an efficient hole transporting (electron blocking) material. Therefore, for low-light conditions, the FF of the hybrid device could increase tremendously.

Figure 4C:
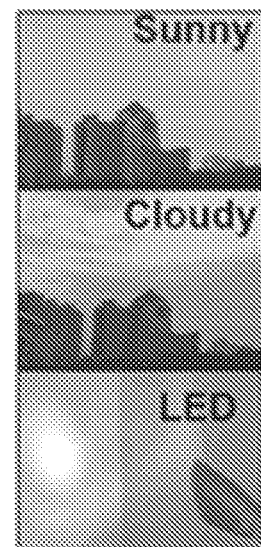
FIG. 4C illustrates photographic images of real-world low-light measurement conditions, according to one or more embodiments of the present disclosure.
Figure 5:
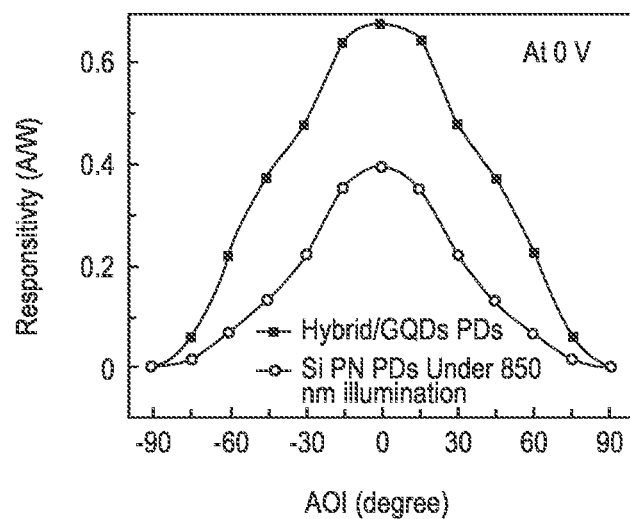
FIG. 5 illustrates is a graphical view of angular dependent responsivity of hybrid/GQDs photodetectors and Si PN photodetectors measured at 0 V under 850-nm illumination, according to one or more embodiments of the present disclosure.

For real-world low-light demonstration, the GQD-modified hybrid device and the commercial Si pyramid p-n device were measured under the three conditions indicated in FIG. 4C. The three conditions are (i) outdoor measurement at 17:30 of a sunny day, (ii) outdoor measurement at 13:00 of a cloudy day, and (iii) indoor LED measurement with a power density of 3.5 mW/cm², respectively. The comparison of open-circuit voltage ($V_{OC}$), short-circuit current ($J_{SC}$), fill factor (FF), and power conversion efficiency (PCE) of the two devices measured under condition (i), (ii), and (iii) are shown in FIG. 4D-G, FIG. 4H-K, and FIG. 4L-O, respectively. FIGS. 4D-G illustrates a graphical view of a comparison of $V_{oc}$ (FIG. 4D), $J_{sc}$ (FIG. 4E), FF (FIG. 4F), and PCE (FIG. 4G) between pyramid Si and hybrid/GQDs solar cells at 17:30 on Apr. 26, 2014 (Sunny) at the location of 25° 1'7" N and 121° 32'31" E, according to one or more embodiments of the present disclosure. FIGS. 4H-K illustrates a graphical view of a comparison of $V_{oc}$ (FIG. 4H), $J_{sc}$ (FIG. 4I), FF (FIG. 4J), and PCE (FIG. 4K) between pyramid Si and hybrid/GQDs solar cells at 13:00 on Apr. 27, 2014 (Cloudy) at the location of 25° 1'7" N and 121° 32'31" E, according to one or more embodiments of the present disclosure. FIGS. 4L-O illustrates a graphical view of a comparison of $V_{oc}$ (FIG. 4L), $J_{sc}$ (FIG. 4M), FF (FIG. 4N), and PCE (FIG. 4O) between pyramid Si and hybrid/GQDs solar cells under a LED with a power density of 3.5 mW/cm$^2$, according to one or more embodiments of the present disclosure. It is shown that under these three low-light conditions, the commercial pyramid Si p-n device shows higher $V_{OC}$ and $J_{SC}$ values. However, the GQD-modified hybrid device shows significantly higher FF for all three conditions, leading to higher PCE values.

In summary, GQD-modified PEDOT:PSS/Si hybrid devices have been fabricated and characterized with self-power, low-noise, high-detectivity, omnidirectional, and high-speed properties for ideal low-light photodetection and photovoltaic applications. Under 532-nm illumination, the detectivity of the device is up to 2.2×10$^{11}$ Jones at 0 bias voltage. Infrared low-light detection at 850 nm has also been performed to demonstrate the capability for high-speed optical communication and biological imaging applications. In addition, outdoor weather dependent and indoor weak light photovoltaic characterizations have also been performed to show enhanced fill factor (FF) in all weak light conditions due to efficient hole transporting (electron blocking) of PEDOT:PSS. Accordingly, the above-mentioned properties of the GQD-modified hybrid devices compatible with real-world functions hold the promise for sensitive photosensing, biological imaging, and low-light energy generation applications in the future.

Other embodiments of the present disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of this disclosure. It should be understood that various features and aspects of the disclosed embodiments can be combined with or substituted for one another in order to form various embodiments. Thus, it is intended that the scope of at least some of the present disclosure should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

The foregoing description of various preferred embodiments of the disclosure have been presented for purposes of illustration and description. It is not intended to be exhaustive or to limit the disclosure to the precise embodiments, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto Various examples have been described. These and other examples are within the scope of the following claims.

What is claimed is:

1. A method of fabricating a photodetector and/or photovoltaic device, comprising:
    fabricating a micropyramid array on a surface of a semiconducting substrate via a chemical etching process;
    depositing a solution comprising an amount of graphene quantum dots (GQDs) and poly(3,4-ethylene-dioxythiophene) polystyrene sulfonate (PEDOT:PSS) as a single layer directly onto the micropyramid array, wherein the amount of GQDs in the solution ranges from about 0.1 wt % to about 0.5 wt % GQDs;
    annealing the solution comprising both the GQDs and PEDOT:PSS to form an annealed layer in direct contact with the micropyramid array;
    wherein the GQDs have diameters ranging, in a Gaussian distribution, from 2.7 nm to 3.9 nm, with an average diameter of 3.2 nm.

2. The method of claim 1, the solution further comprising one or more of dimethyl sulfoxide and a surfactant.

3. The method of claim 1, the solution further comprising about 5 wt % of dimethyl sulfoxide.

4. The method of claim 1, the solution further comprising about 0.1 wt % of surfactant.

5. The method of claim 1, wherein the depositing includes spin-coating.

6. The method of claim 1, wherein the semiconducting substrate is selected from a Group IV elemental semiconductor, Group IV compound semiconductor, Group VI elemental semiconductor, III-V semiconductor, II-VI semiconductor, I-VII semiconductor, IV-VI semiconductor, IV-VI semiconductor, V-VI semiconductor, II-V semiconductor, I-III-VI$_2$ semiconductor, layered semiconductor, magnetic semiconductor, charge-transfer semiconductor, and combinations thereof.

7. The method of claim 1, wherein the semiconducting substrate includes one or more of zinc, cadmium, aluminum, gallium, indium, thallium, carbon, silicon, germanium, tin, lead, arsenic, antimony, bismuth, sulfur, selenium, tellurium, and polonium.

8. The method of claim 1, wherein the semiconducting substrate is a silicon substrate.

9. The method of claim 1, wherein the semiconducting substrate is an n-type silicon substrate.

10. The method of claim 1, wherein the solution is annealed at temperatures ranging from about 140° C. to about 180° C.

11. The method of claim 1, wherein the solution is annealed at about 165° C. for about 10 minutes.

12. The method of claim 1, further comprising depositing electrodes on opposing surfaces of the semiconducting substrate.

13. The method of claim 12, wherein the electrodes are deposited via thermal evaporation.

14. The method of claim 12, wherein the electrodes include one or more of Ag, Al, Au, Pt, and Ti.

15. The method of claim 1, the solution further comprising fluoro additives.

\* \* \* \* \*